United States Patent [19]

Makino et al.

[11] Patent Number: 5,464,674

[45] Date of Patent: * Nov. 7, 1995

[54] MAGNETIC RECORDING MEDIUM AND METHOD FOR ITS PRODUCTION

[75] Inventors: Ichiro Makino, Machida; Akira Mitsui, Yokohama; Mikio Takehara, Yokohama; Eiichi Ando, Yokohama; Junichi Ebisawa, Tokyo; Koichi Suzuki, Yokohama; Kiyoshi Matsumoto, Tokyo; Toru Iseda, Yokohama; Susumu Suzuki, Kawasaki, all of Japan

[73] Assignee: Asahi Glass Company Ltd., Tokyo, Japan

[ * ] Notice: The portion of the term of this patent subsequent to May 5, 2009, has been disclaimed.

[21] Appl. No.: 3,417

[22] Filed: Jan. 12, 1993

Related U.S. Application Data

[60] Division of Ser. No. 489,954, Mar. 7, 1990, Pat. No. 5,209,835, which is a continuation-in-part of Ser. No. 318,330, Mar. 3, 1989, Pat. No. 5,110,637.

[30] Foreign Application Priority Data

| Mar. 3, 1988 | [JP] | Japan | 63-48765 |
| Mar. 31, 1988 | [JP] | Japan | 63-76202 |
| Jun. 14, 1988 | [JP] | Japan | 63-144827 |
| Oct. 21, 1988 | [JP] | Japan | 63-264163 |
| Mar. 7, 1989 | [JP] | Japan | 1-53009 |
| Mar. 1, 1990 | [JP] | Japan | 2-47138 |

[51] Int. Cl.$^6$ .............. G11B 5/66; C23C 14/00; C03C 3/155

[52] U.S. Cl. .......... 428/694 T; 428/432; 428/446; 428/472; 428/689; 428/694 TP; 428/694 TZ; 428/697; 428/702; 428/704; 501/51; 501/67; 204/192.16; 204/192.15; 204/192.2; 427/130

[58] Field of Search ............... 428/900, 694 T, 428/694 TP, 694 TZ, 432, 446, 472, 689, 697, 702, 704; 204/192.16, 192.15, 192.2; 427/130; 501/51, 67

[56] References Cited

U.S. PATENT DOCUMENTS

| 4,840,844 | 6/1989 | Futamoto et al. | 428/336 |
| 4,842,956 | 6/1989 | Kobayashi | 428/611 |
| 4,883,711 | 11/1989 | Shinoishi et al. | 428/336 |
| 4,898,774 | 2/1990 | Yamashia et al. | 428/336 |
| 4,929,500 | 5/1990 | Yamashita et al. | 428/336 |
| 4,983,465 | 1/1991 | Shimizu et al. | 428/472 |
| 5,094,896 | 3/1992 | Morita et al. | 428/64 |
| 5,110,637 | 5/1992 | Ando et al. | 428/36 |

FOREIGN PATENT DOCUMENTS 0374931  6/1990  European Pat. Off. .

OTHER PUBLICATIONS

Patent Abstracts of Japan, JP-A-61 145 823, AN 59-267343, Jul. 3, 1986, M. Mashit, et al., "Molecular Beam Epitaxial Growth Method".

Patent Abstracts of Japan, JP-A-61 144 029, AN 59-265792, Jul. 1, 1986, T. Serikawa, "Method and Apparatus for Manufacturing Silicon Oxide Film Containing Phosphorus".

Patent Abstracts of Japan, JP-A-62 073 202, AN 60-213845, Apr. 3, 1987, Y. Oi, "Production of Thin Optical Film".

Patent Abstracts of Japan, JP-A-55 110 127, AN 54-18238, Aug. 25, 1980, M. Azuma, et al., "Preparation of Plastic Antireflection Film".

Primary Examiner—L. Kiliman
Attorney, Agent, or Firm—Oblon, Spivak, McClelland, Maier & Neustadt

[57] ABSTRACT

A magnetic recording medium comprising a magnetic recording layer and at least one protective layer formed on the recording layer, wherein the outermost protective layer on the side exposed to air is made of an oxide film.

12 Claims, No Drawings

MAGNETIC RECORDING MEDIUM AND METHOD FOR ITS PRODUCTION

This is a division of application Ser. No. 07/489,954, filed on Mar. 7, 1990, now U.S. Pat. No. 5,203,835; which is a CIP of application Ser. No. 07/318,330 filed on Mar. 3, 1989, now U.S. Pat. No. 5,110,637.

BACKGROUND OF THE INVENTION

FIELD OF THE INVENTION

The present invention relates to a magnetic recording medium, particularly a magnetic recording medium excellent in the corrosion resistance and the abrasion resistance, and a method for its production.

DISCUSSION OF BACKGROUND

Heretofore, in the field of magnetic disks as one field of memory disks, a Co type thin film magnetic recording layer has been provided in an attempt for high densification of a small-size Winchester type magnetic disk of 5¼ inch or less. For example, Co—P, Co—Ni—P, Co—Ni—Cr, Co—Cr, Co—Pt, Co—Cr—Pt, Co—Ni, Co—Ni—Pt, Co—CrNi and Co—Cr—Ni—Pt may be mentioned as representatives. Other than these, alloys using Sm, Re or rare earth elements, or those having various elements incorporated to such compositions to improve the magnetic properties, have been reported.

These thin film magnetic recording layers are thin metal films and accordingly have a problem that they are likely to be corroded by moisture, oxygen or carbon dioxide in air, whereby the magnetic recording properties tend to deteriorate. This tendency is particularly remarkable under high humidity conditions or under moisture condensation conditions.

To prevent such a problem, it has been in practice to provide at least one protective layer on the surface of the recording layer so that the recording layer will not be exposed directly to atmosphere. As such a protective layer, a carbon-type film is mainly used. However, an oxide film such as $SiO_2$ or $TiO_2$, has also been proposed.

SUMMARY OF THE INVENTION

It is an object of the present invention to solve the above-mentioned problems inherent to the conventional techniques.

It is a further object of the present invention to provide a magnetic recording medium having a protective layer having excellent abrasion resistance. In conventional magnetic disks, carbon or the like is used as the protective layer, but the corrosion resistance has been inadequate. Therefore, it has been necessary to increase the thickness of the carbon layer as the protective layer in order to improve the corrosion resistance, or to insert a layer such as a Cr film as an intermediate layer between the magnetic layer and the carbon protective layer in order to improve the adhesion to the magnetic layer. Consequently, the overall thickness of the protective layer increases, and the distance between the magnetic layer and the magnetic head floating with a certain height in the space above the protective layer, will necessarily increase by a distance corresponding to the increase of the overall thickness of the protective layer. The increase in the distance between the magnetic layer and the magnetic head is very disadvantageous when the recording density is to be increased.

The present invention has been made to solve the above problem and provides a magnetic recording medium comprising a magnetic recording layer and at least one protective layer formed on the recording layer, wherein the outermost protective layer on the side exposed to air is made of an oxide film.

Further, the present invention provides a method for producing the above oxide film, particularly the one composed of an amorphous oxide film.

DETAILED DESCRIPTION OF THE PREFERRED EMBODIMENTS

More specifically, the present invention provides an amorphous oxide film composed mainly of an oxide containing at least one member selected from the group consisting of Zr, Ti, Hf, Sn, Ta and In and at least one member selected from the group consisting of B (boron) and Si (silicon), and a method for producing such an amorphous oxide film, which comprises sputtering a substance containing at least one member selected from the group consisting of Zr, Ti, Hf, Sn, Ta and In and at least one member selected from the group consisting of B and Si to produce an amorphous oxide film composed mainly of an oxide containing at least one member selected from the group consisting of Zr, Ti, Hf, Sn, Ta and In and at least one member selected from the group consisting of B and Si.

The present invention is based on a discovery that the amorphous oxide containing at least one member selected from the group consisting of Zr, Ti, Hf, Sn, Ta and In and at least one member selected from the group consisting of B and Si is a thin film excellent in the scratching resistance, the abrasion resistance and the chemical durability.

Table 1 shows the properties of various amorphous oxide films of the present invention. They are formed into films by reactive DC sputtering or reactive RF sputtering by means of targets having compositions as identified in Table 1, respectively. The crystallinity was evaluated by thin film X-ray diffraction.

The corrosion resistance and the abrasion resistance were measured by preparing a magnetic disk sample having the protective layer as identified in Table 1 provided on the magnetic recording layer.

The test for the corrosion resistance was conducted by leaving the sample in a constant temperature and humidity chamber at 80° C. under a relative humidity of from 90 to 95% and observing the color change of the surface after expiration of a predetermined time to evaluate the corrosion resistance. The sample with no color change was evaluated as satisfactory (O), and the one with a color change was evaluated as unsatisfactory (X).

The test for the abrasion resistance was conducted as follows. A 300 rpm start-stop cycle test was repeated 100 times under an application of a load of 15 g to the thin film head without coating any lubricant. The sample with the maximum value among the static and kinematic friction coefficients being not higher than 0.6, was evaluated as satisfactory (O), and the sample with the maximum value exceeding 0.6, was evaluated as unsatisfactory (X).

It is evident from Table 1 that with respect to the $ZrB_xO_y$ film, a crystalline film tends to be formed when the amount of B in the film is small, and an amorphous film tends to be formed when the amount of B is large. It is also apparent that while the crystalline film is inferior in the abrasion resistance, the amorphous film is excellent in the abrasion resistance. This is considered attributable to the fact that the surface of the amorphous film is smooth. Thus, the $ZrB_xO_y$ film (the atomic ratio x of B to Zr in the film is $0.1<x$, preferably $1.0 \leq x$) is excellent in the scratching resistance and the abrasion resistance. The $B_2O_3$ film is hygroscopic and dissolves upon absorption of moisture in air. Therefore, in the $ZrB_xO_y$ film, x is preferably $x<4$.

The atomic ratio of O (oxygen) to Zr in the $ZrB_xO_y$ film is not particularly limited. However, if it is too high, the film structure tends to be rough, and a roughened film will be obtained. On the other hand, if the atomic ratio is too small, the film tends to be metallic, whereby the scratching resistance of the film tends to be low. Therefore, the atomic ratio of O is preferably at such a level to present a composite system of $ZrO_2$ and $B_2O_3$. Namely, when the composite oxide is represented by $ZrO_2+xBO_{1.5}$, it is preferred that y (oxygen)=2+1.5x, when B is contained in an atomic ratio of x relative to Zr.

Thus, the $ZrB_xO_y$ film where $0.1<x<2.3$ and $2<y<5.5$, has good scratching resistance and abrasion resistance and thus is an amorphous oxide film suitable for the purpose of the present invention.

Further, as shown in Table 1, as the content of B in the film increases, the corrosion resistance tends to deteriorate. The corrosion resistance will be unsatisfactory in seven days where $x \geq 4$. Accordingly, to use it as a protective film for a magnetic disk, it is preferably an amorphous oxide film of $ZrB_xO_y$ ($x<4$, more preferably $x<2.3$).

As described in the foregoing, by the addition of B to the $ZrO_2$ film, the film becomes amorphous and the surface becomes smooth, which contribute to the improvement of the abrasion resistance and the scratching resistance. Further, as compared with a carbon-type film, the internal stress is small, whereby it is advantageous from the viewpoint of the adhesion to the substrate (glass, plastic, etc.) or to the primer coating layer on the substrate. This is particularly advantageous in the case where a thick film is formed.

Next, with respect to the $ZrSi_zO_y$ film, it is possible to obtain a film which is also amorphous and has high abrasion resistance and scratching resistance.

Table 1 shows cases wherein $ZrSi_zO_y$ films were formed by DC sputtering by means of a target of Zr—Si system. More particularly, in the $ZrSi_zO_y$ film, z (the atomic ratio of Si to Zr in the film) is preferably $0.05 \leq z<19$. If $z<0.05$, the film will be not amorphous, whereby no adequate physical durability will be obtained. On the other hand, if $z \geq 19$, the corrosion resistance tends to be poor. Further, y (the atomic ratio of O to Zr in the $ZrSi_zO_y$ film) is preferably $y=2+2z$ when Si is contained in an atomic ratio of z to Zr, for the same reason as mentioned with respect to the $ZrB_xO_y$ film.

Accordingly, when it is used as a protective layer for a magnetic disk, it is preferably a $ZrSi_zO_y$ film where $0.05 \leq z<19$ and $2.1 \leq y<40$.

Further, a $ZrB_xSi_zO_y$ film is also a film which is suitable for the purpose of the present invention. In such a film, the atomic ratio x of B, the atomic ratio z of Si and the atomic ratio y of O to Zr are preferably $x+z \geq 0.05$, since the film will be amorphous and will have high scratching resistance and abrasion resistance. Further, when $x+z-3>0$ and $x-3z+1>0$, the corrosion resistance of the film will be inadequate, and when $z \geq 19$, the corrosion resistance will also be poor. This may be explained in such a way that the $ZrB_xSi_zO_y$ film is assumed to be a mixture of an oxide of Zr—B—O system and an oxide of B—Si—O system, from the data of the $ZrB_xO_y$ film, it is evident that when the atomic ratio of B to Zr exceeds 3 in the Zr—B—O system, the chemical stability tends to be inadequate, but if this excess B is contained in the B—Si—O system, when the atomic ratio of B to Si in the B—Si—O oxide exceeds 0.25, this B—Si—O oxide will be chemically instable. For the same reason as mentioned in the case of the $ZrB_xO_y$, y is preferably 2+1.5x+2z, as this film is considered to be a composite system of $ZrO_2+B_2O_3+SiO_2$. Therefore, y is preferably substantially $2<y<40$.

An oxide containing a metal other than Zr, i.e. Ti, Hf, Sn, Ta or In and at least one member selected from the group consisting of B and Si, is also amorphous, whereby adequate scratching resistance, abrasion resistance and corrosion resistance will be obtained. A $TiSi_zO_y$ film is presented as Sample No. 26 in Table 1, as one example.

The amorphous oxide film of the present invention may contain very small amounts of elements other than Zr, Ti, Hf, Sn, Ta, In, B, Si and O.

The amorphous oxide film of the present invention can be formed by a wet system method such as a spray method, or by a physical vapor deposition method such as a CVD (chemical vapor deposition) method, a vacuum vapor deposition method or a sputtering method. Particularly preferred is a sputtering method, since it is thereby possible to obtain a film having a high adhesive strength as compared with other methods. In particular, a uniform film can be obtained by sputtering in an atmosphere of the mixture of argon and oxygen in vacuum of a level of $1\times10^{-3}$ to $1\times10^{-2}$ Torr by using a non-oxide type target or electrode comprising at least one member (M) selected from the group consisting of Zr, Ti, Hf, Sn, Ta and In and at least one member selected from the group consisting of boron (B) and silicon (Si), for example, by using a non-oxide single system or a non-oxide composite system target or electrode such as a zirconium boride single system, a zirconium silicide single system, a zirconium boride-metal zirconium composite system, a zirconium boride-zirconium silicide composite system, a zirconium boride-metal silicon composite system, a zirconium silicide-metal zirconium composite system, a zirconium silicide-boron composite system, a zirconium silicide-metal silicon composite system, a zirconium boride-zirconium silicide-metal zirconium composite system, a zirconium boride-zirconium silicide-metal silicon composite system, a zirconium boride-boron composite system or a zirconium boride-zirconium silicide-boron composite system, to obtain a film of e.g. $ZrB_xO_y$, $ZrSi_zO_y$ or $ZrB_xSi_zO_y$, as shown in Table 2. If the pressure is less than $1\times10^{-3}$ Torr, the electric discharge tends to be unstable, and if the pressure is higher than $1\times10^{-2}$ Torr, particles sputtered tend to collide to each other, whereby the film-forming speed will be slow. Such a non-oxide type target has electrical conductivity, and film-forming can be conducted by a DC sputtering method, whereby a uniform film can be formed at a high speed over a large surface area.

When reactive sputtering is conducted using a non-oxide target, the ratios of B and Si to Zr in the target will be maintained in the film formed by using that target, as is also apparent from Table 1. The same applies also to Si or Si+B in the case of forming a $ZrSi_xO_y$ film or a $ZrB_xSi_zO_y$ film.

Taking the above tendency into consideration, it is preferred to employ a target or electrode comprising from 90 to 30 atomic % of Zr and from 9 to 70 atomic % of B in the case where a $ZrB_xO_y$ ($0.1<x<2.3$, $2<y<5.5$) film is formed by reactive sputtering. Likewise, the films desired to be formed and the compositions of the targets or electrodes required therefore are shown in Table 2.

Otherwise, it is possible to form a film by sputtering by using an oxide target containing at least one member selected from the group consisting of Zr, Ti, Hf, Sn, In and Ta and at least one member selected from the group consisting of boron and silicon in a non-reducing atmosphere having a proper amount of oxygen incorporated under a vacuum at a level of from $1\times10^{-3}$ to $1\times10^{-2}$ Torr. If the pressure is less than $1\times10^{-3}$ Torr, the electric discharge tends to be unstable, and if the pressure is higher than $1\times10^{-2}$ Torr, sputtered particles collide to each other, whereby the film-forming speed tends to be slow. For example, as an oxide target in the case of forming an oxide film containing Zr and at least one member selected from the group consisting of B and Si, there may be employed a target of an oxide composite system comprising at least one member selected from the group consisting of boron oxide and silicon oxide and zirconium oxide (inclusive stabilized or partially stabilized zirconia), such as a target of a zirconium oxide-boron oxide composite system, a zirconium oxide-silicon oxide composite system or a zirconium oxide-boron oxide-silicon oxide composite system. The compositional ranges of preferred targets in this case are shown in Table 2.

When reactive sputtering is conducted by using a non-oxide target, if the proportion of oxygen in the ambient gas is increased, a transparent film will be formed, but a film-forming rate will gradually decrease. In order to conduct the film-forming operation at a high film-forming rate, it is necessary to limit the oxygen concentration in the ambient gas to a certain level, i.e. it is necessary to conduct the film-forming operation within an oxygen concentration range in a transition region for the change from an absorptive film to a transparent film. However, it is very difficult to control the operation so that sputtering is conducted within the transition region. On the other hand, a transparent film can be formed if sputtering is conducted by using a complete oxide target, but the film-forming rate is relatively slow in this case. Therefore, by using a target composed of a partially oxidized substance, it is possible to form a transparent film under a stabilized condition at a high speed. For this purpose, it is possible to employ a target of an oxide-non-oxide composite system comprising at least one member selected from the group consisting of zirconium oxide (inclusive of stabilized zirconia), boron oxide and silicon oxide and at least one member selected from the group consisting of metal zirconium, boron, metal silicon, zirconium boride and zirconium silicide, such as a target of a zirconium oxide-zirconium boride composite system, a boron oxide-zirconium boride composite system, or a silicon oxide-zirconium boride composite system.

Such a target may have a composition obtained by suitably mixing "non-oxide target" and "oxide target" as identified in Table 2 so that the degree of oxidation of the target is adjusted to a necessary level. Accordingly, the composition of such a target is preferably within the ranges as identified in the column for "Target of an oxide-non-oxide mixture system" in Table 2. When the film-forming is conducted by using such a target, the sputtering atmosphere may be determined depending upon the oxidation degree of the target so that the non-oxide component can be oxidized.

The above oxide target or the oxide-non-oxide composite system target may be used as a tablet for vapor deposition, and an amorphous oxide film of the present invention may be formed by heating and evaporating the tablet by means of e.g. electron beams. By such a vapor deposition method, precise control of the film thickness is easy as compared with the wet method such as a spraying method.

The composition of the target and the composition of the film formed by using the target may vary depending upon the film-forming conditions and can not simply be defined. The examples given in Table 1 are merely exemplary.

The above-mentioned electrode or target may be formed, for example, by the following method. A powder or a powder mixture comprising at least one member selected from the group consisting of metal zirconium, boron, metal silicon, zirconium boride, zirconium silicide, zirconium oxide (inclusive of stabilized or partially stabilized zirconia containing from 3 to 8 mol% of e.g. $Y_2O_3$, CaO or MgO), boron oxide and silicon oxide, is subjected to high temperature high pressure pressing or high pressure pressing, or sintering of a high pressure pressed product, to obtain a single system or composite system electrode or target of the present invention. In such a case, the particle size of the powder is preferably from 0.05 to 40 μm. The above electrode or target may contain a total amount of not more than 2% by weight of iron, aluminum, calcium, yttrium, manganese and hydrogen. Carbon is liberated in the form of $CO_2$ during the film-forming operation. It has been confirmed that the same properties can be obtained even when carbon is contained in an amount of not more than 20% by weight. Further, the electrode or target of the present invention shows substantially the same effect even when copper, niobium, vanadium, chromium, molybdenum, tungsten, cobalt, rhodium, iridium, etc. are contained at a level of impurities i.e. in trace amounts.

TABLE 1

| Sample No. | Target constituting substance | Target composition (atom %) | Film-forming method [ambient gas] | Film composition B(x) | Film composition Si(z) | Film composition O(y) | Crystallinity | Film composition | Corrosion resistance (color change) Number of days 1 day | 4 days | 7 days | Abrasion After 100 times | Magnetic layer (thickness: 600 Å) |
|---|---|---|---|---|---|---|---|---|---|---|---|---|---|
| Comparative Example 1 | C (carbon) | C (carbon) | DC sputtering [Ar + O₂] | — | — | — | Crystalline | C film | ○ | ○ | X | X | Co—Ni—Pt system |
| Example |  |  |  |  |  |  |  |  |  |  |  |  |  |
| 1 | Zr—ZrB₂ | 91Zr—9B |  | 0.098 | — | 2.1 | Crystalline | ZrB$_x$O$_y$ film | ○ | ○ | ○ | X | Co—Ni—Pt system |
| 2 | Zr—ZrB₂ | 89Zr—11B |  | 0.12 | — | 2.2 | Amorphous |  | ○ | ○ | ○ | ○ | Co—Ni—Pt system |
| 3 | Zr—ZrB₂ | 70Zr—30B |  | 0.43 | — | 2.6 | Amorphous |  | ○ | ○ | ○ | ○ | Co—Ni—Pt system |
| 4 | Zr—ZrB₂ | 50Zr—50B |  | 1 | — | 3.5 | Amorphous |  | ○ | ○ | ○ | ○ | Co—Ni—Pt system |
| 5 | Zr—ZrB₂ | 40Zr—60B |  | 1.5 | — | 4.3 | Amorphous |  | ○ | ○ | ○ | ○ | Co—Ni—Pt system |
| 6 | Zr—ZrB₂ | 33Zr—67B |  | 2 | — | 5 | Amorphous |  | ○ | ○ | ○ | ○ | Co—Ni—Pt system |
| 7 | ZrB₂—B | 30Zr—70B |  | 2.3 | — | 5.5 | Amorphous |  | ○ | ○ | ○ | ○ | Co—Ni—Pt system |
| 8 | ZrB₂—B | 20Zr—80B |  | 4 | — | 8 | Amorphous |  | ○ | ○ | X | X | Co—Ni—Pt system |
| 9 | ZrB₂—ZrO₂ | 33.3Zr—3.3B—63.3O |  | 0.10 | — | 2.18 | Crystalline |  | ○ | ○ | ○ | ○ | Co—Ni—Pt system |
| 10 | ZrB₂—ZrO₂ | 33.3Zr—33.3B—33.3O | RF sputtering [Ar + O₂] | 1 | — | 3.5 | Amorphous |  | ○ | ○ | ○ | ○ | Co—Ni—Pt system |
| 11 | ZrB₂—ZrO₂ | 33Zr—63B—4O |  | 1.9 | — | 4.85 | Amorphous |  | ○ | ○ | X | X | Co—Ni—Pt system |
| 12 | Zr—ZrSi₂ | 95Zr—5Si | DC sputtering [Ar + O₂] | — | 0.045 | 2.1 | Crystalline | ZrSi$_z$O$_y$ film | ○ | ○ | ○ | ○ | Co—Ni—Pt system |
| 13 | Zr—ZrSi₂ | 91Zr—9Si |  | — | 0.1 | 2.2 | Amorphous |  | ○ | ○ | ○ | X | Co—Ni—Pt system |
| 14 | Zr—ZrSi₂ | 50Zr—50Si | DC sputtering [Ar + O₂] | — | 1 | 4 | Amorphous | ZrSi$_z$O$_y$ film | ○ | ○ | ○ | ○ | Co—Ni—Pt system |
| 15 | ZrSi₂ | 33Zr—67Si |  | — | 2.0 | 6.0 | Amorphous |  | ○ | ○ | ○ | ○ | Co—Ni—Pt system |
| 16 | ZrSi₂—Si | 20Zr—80Si |  | — | 4 | 10 | Amorphous |  | ○ | ○ | ○ | ○ | Co—Ni—Pt system |
| 17 | ZrSi₂—Si | 10Zr—90Si |  | — | 9 | 20 | Amorphous |  | ○ | ○ | ○ | ○ | Co—Ni—Pt system |
| 18 | ZrSi₂—Si | 5Zr—95Si |  | — | 19 | 40 | Amorphous |  | ○ | ○ | X | X | Co—Ni—Pt system |
| 19 | Zr—ZrB₂—ZrSi₂ | 96Zr—2B—2Si |  | 0.02 | 0.02 | 2.07 | Crystalline | ZrB$_x$Si$_z$O$_y$ film | ○ | ○ | ○ | ○ | Co—Ni—Pt system |
| 20 | ZrB₂—ZrSi₂ | 33Zr—33B—33Si |  | 1 | 1 | 5.5 | Amorphous |  | ○ | ○ | ○ | ○ | Co—Ni—Pt system |
| 21 | ZrB₂—ZrSi₂—Si | 20Zr—20B—60Si |  | 1 | 3 | 9.5 | Amorphous |  | ○ | ○ | ○ | ○ | Co—Ni—Pt system |
| 22 | ZrB₂—Si | 9Zr—18B—73Si |  | 2 | 8 | 21 | Amorphous |  | ○ | ○ | ○ | ○ | Co—Ni—Pt system |
| 23 | ZrB₂—ZrSi₂—Si | 10Zr—10B—80Si |  | 1 | 8 | 19.5 | Amorphous |  | ○ | ○ | ○ | ○ | Co—Ni—Pt system |
| 24 | ZrSi₂—5B—90Si | 5Zr—5B—90Si |  | 1 | 0.18 | 39.5 | Amorphous |  | ○ | ○ | ○ | ○ | Co—Ni—Pt system |
| 25 | ZrB₂—ZrSi₂—B | 20Zr—60B—20Si |  | 3 | 1 | 8.5 | Amorphous |  | ○ | ○ | X | ○ | Co—Ni—Pt system |
| 26 | TiSi₂—Si | 24Ti—76Si |  | — | 3.2 | 8.4 | Amorphous | TiSi$_x$O$_y$ film | ○ | ○ | ○ | ○ | Co—Ni—Pt system |

TABLE 2

| Desired film composition | Composition of the target (electrode) (atomic %) | | |
|---|---|---|---|
| | Non-oxide target (electrode) | Oxide target (tablet) | Target of an oxide-non-oxide mixture system |
| $ZrB_xO_y$ $0.1 < x < 4$ $2 < y < 8$ | $91 > a > 20$ $9 < b < 80$ | $31 > a > 7$ $3 < b < 31$ $67 > d > 61$ | $91 > a > 7$ $3 < b < 80$ $67 > d > 0$ |
| $ZrB_xO_y$ $0.1 < x < 2.3$ $2 < y < 5.5$ | $91 > a > 30$ $9 < b < 70$ | $31 > a > 11$ $3 < b < 27$ $67 > d > 62$ | $91 > a > 11$ $3 < b < 70$ $67 > d > 0$ |
| $ZrSi_zO_y$ $0.05 \leq z < 19$ $2.1 \leq y < 40$ | $96 > a > 5$ $4 < c < 95$ | $32 > a > 1$ $1 < c < 32$ d about 67 | $96 > a > 1$ $1 < c < 95$ $67 > d > 0$ |
| $ZrB_xSi_zO_y$ $0.05 \leq x + z < 19$ $2 < y < 40$ (provided that a composition wherein $x + z - 3 > 0$ and $x - 3z + 1 > 0$ is excluded.) | $96 > a > 5$ $4 < b + c < 95$ (provided that a composition wherein a <25 and c < 25 is excluded.) | $32 > a > 1$ $1 < b + c < 32$ $67 > d > 61$ (provided that a composition wherein $a < 0.25(100-d)$ and $c < 0.25(100-d)$ is excluded.) | $96 > a > 1$ $1 < b + c < 95$ $67 > d > 0$ (provided that a composition wherein $a < 0.25(100-d)$ and $c < 0.25(100-d)$ is excluded.) |

The protective layer of the present invention has a relatively small internal stress and a strong adhesive force to a metal, glass or oxide and thus is suitable as a protective layer for memory disks.

With the film of the present invention, the thicker the thickness, the higher the effectiveness as the protective layer. However, for high density magnetic disks, the distance between the magnetic head and the recording layer is critical, and so long as the magnetic head is floating, the smaller the distance, the more suitable for high density recording. Therefore, there is a limitation in the thickness of the protective layer. The thickness of the protective layer is preferably within a range of from 40 to 2,000Å, more preferably from 100 to 500Å.

Further, in the present invention, in order to strengthen the bonding of the oxide film and the magnetic recording layer, it is possible to interpose a film made of at least one member selected from the group consisting of chromium, titanium, tantalum, zirconium, tungsten and hafnium, between the oxide film and the magnetic recording layer. This film may be formed on the magnetic recording layer by such a means as sputtering in the same manner as in the case of the oxide film and the magnetic recording layer.

In a case where even a very small defect is critical as in the case of a magnetic recording medium, only a very small corrosion will be problematic.

The protective layer of the present invention is very dense and has little defect. Further, the protective layer of the present invention can be formed as an amorphous film having no crystal grain boundaries which are likely to create a problem such as precipitation of impurities, by properly adjusting the contents of the constituting elements. Such a film is strong against corrosion.

A carbon-type film is inferior in the corrosion resistance to the film of the present invention. The reason is not necessarily clear, but it is believed that the film itself is lacking in the density.

Further, it is believed that the film of the present invention is superior to a usual carbon-type film in the abrasion resistance because it has a higher hardness than the carbon-type film.

EXAMPLES

Magnetic disk samples were prepared which had the protective layers as identified in Table 1 on the respective magnetic recording layers, and the corrosion resistance and the abrasion resistance were examined. The results are shown in Table 1 together with the target composition, the film composition and the crystallinity of the film.

According to the present invention, an adequate protecting effect can be obtained with a protective layer as thin as 250Å even under an environmental condition of 80° C. and a relative humidity of from 90 to 95%. Particularly when the ratio of Zr/B, Zr/Si or Zr/(B+Si) is selected within a proper range, it is possible to effectively prevent even fine corrosion. Further, it is possible to effectively reduce the internal stress if the ratio of Zr/B, Zr/Si or Zr/(B+Si) is selected within a proper range. Namely, it is usually possible to reduce the internal stress by increasing the number of atoms of B, Si or (B+Si) by reducing the ratio of Zr/B, Zr/Si or Zr/(B+Si), respectively.

Further, the protective layer of the present invention has a good adhesive force to a metal film, and it also has a good adhesive force to glass or an oxide such as ceramics.

Furthermore, the protective layer of the present invention is effective as an alkali barrier coat layer for a glass susceptible to elution of alkali to its surface, such as soda lime glass.

The protective layer of the present invention has adequate corrosion resistance even with a film thickness as thin as from 100 to 500Å, and it can be formed in the form of a homogeneous amorphous film having no grain boundaries from the microscopic point of view. It is particularly effective when used for memory disks such as high density magnetic disks where thinness is required in addition to the surface density and uniformity. The film of the present invention has high hardness and thus is excellent in the abrasion resistance and scratch resistance. The film of the present invention is also excellent in the durability as measured by CSS test as a kind of friction and abrasion tests between the magnetic disk surface and the magnetic head. Further, it has a feature that the friction is small.

What is claimed is:

1. A magnetic recording medium comprising a magnetic recording layer and at least one outermost protective layer formed on the recording layer, wherein said outermost protective layer is made of a uniform and homogeneous oxide film having no crystal grain boundaries consisting essentially of $ZrB_xO_y$, wherein the atomic ratio x of boron to zirconium is $0.1<x<4$ and the atomic ratio y of oxygen to zirconium is $2<y<8$.

2. The magnetic recording medium according to claim 1, wherein the amorphous oxide film is composed mainly of $ZrB_xO_y$, wherein the atomic ratio x of boron to zirconium is $0.1<x<2.3$ and that atomic ratio y of oxygen to zirconium is $2<y<5.5$.

3. A magnetic recording medium comprising a magnetic recording layer and at least one outermost protective layer formed on the recording layer, wherein said outermost protective layer is made of a uniform and homogeneous amorphous oxide film having no crystal grain boundaries consisting essentially of $ZrSi_zO_y$, wherein the atomic ratio z of silicon to zirconium is $0.05 \leq z \leq 19$ and the atomic ratio y of oxygen to zirconium is $2<y<40$.

4. A magnetic recording medium comprising a magnetic recording layer and at least one outermost protective layer formed on the recording layer, wherein said outermost protective layer is made of a uniform and homogeneous amorphous oxide film having no crystal grain boundaries consisting essentially of $ZrB_xSi_zO_y$, wherein the atomic ratio x of boron to zirconium, the atomic ratio z of silicon to zirconium, and the atomic ratio y of oxygen to zirconium are $0.05 \leq x+z<19$ and $2<y<40$ with the proviso that a layer wherein $x+z-3>0$ and $x-3z+1>0$ is excluded.

5. The magnetic recording medium according to any one of claims 1, 3 or 4, wherein a third layer is formed between the oxide film and the magnetic recording layer, and the third layer is made of at least one member selected from the group consisting of chromium, titanium, tantalum, zirconium, tungsten and hafnium.

6. The magnetic recording medium according to any one of claims 1, 3 or 4, wherein the oxide film is the one formed by sputtering in a reduced pressure atmosphere containing oxygen and inert gas.

7. The magnetic recording medium according to any one of claims 1, 3 or 4, wherein the oxide film is the one formed by sputtering in a reduced atmosphere containing an inert gas and substantial no oxygen by means of a target composed of an oxide and a boride.

8. The magnetic recording medium according to any one of claims 1, 3 or 4, wherein the oxide film is the one formed by sputtering in a reduced pressure atmosphere containing an inert gas and substantial no oxygen by means of a target composed of an oxide and a silicide.

9. The magnetic recording medium according to claim 6, wherein the sputtering is conducted by a DC magnetron method.

10. The magnetic recording medium according to claim 7, wherein the sputtering is conducted by a DC magnetron method.

11. The magnetic recording medium according to claim 8, wherein the sputtering is conducted by a DC magnetron method.

12. A method for producing an amorphous oxide film composed mainly of $ZrSi_zO_y$, wherein the atomic ratio z of silicon to zirconium is $0.05 \leq z<19$ and the atomic ratio y of oxygen to zirconium is $2.1 \leq y<40$, which comprises sputtering a target composed mainly of a substance comprising from 1 to 96 atomic % of zirconium, from 1 to 95 atomic % of silicon, and from 0 to 67 atomic % of oxygen.

* * * * *